United States Patent
Cho

(10) Patent No.: US 6,521,522 B2
(45) Date of Patent: Feb. 18, 2003

(54) METHOD FOR FORMING CONTACT HOLES FOR METAL INTERCONNECTION IN SEMICONDUCTOR DEVICES

(75) Inventor: Yun-Seok Cho, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/893,425

(22) Filed: Jun. 29, 2001

(65) Prior Publication Data

US 2002/0001940 A1 Jan. 3, 2002

(30) Foreign Application Priority Data

Jun. 29, 2000 (KR) .............................. 00-36410

(51) Int. Cl.[7] .......................................... H01L 21/4763
(52) U.S. Cl. ....................... 438/624; 438/629; 438/634; 438/637; 438/647; 438/671; 438/672
(58) Field of Search ................................ 438/624, 629, 438/633–634, 637–640, 657, 647, 671–673

(56) References Cited

U.S. PATENT DOCUMENTS

| | | | | |
|---|---|---|---|---|
| 5,942,803 A | * | 8/1999 | Shim et al. .................. 257/774 |
| 6,010,943 A | * | 1/2000 | Liao .............................. 257/303 |
| 6,037,234 A | * | 3/2000 | Hong et al. .................. 438/396 |
| 6,043,119 A | * | 3/2000 | Wu et al. ..................... 438/254 |
| 6,043,131 A | * | 3/2000 | Yu ................................ 438/239 |
| 6,066,541 A | * | 5/2000 | Hsieh et al. ................. 438/253 |
| 6,077,755 A | * | 6/2000 | Green .......................... 438/253 |
| 6,168,992 B1 | * | 1/2001 | Lee .............................. 438/253 |
| 6,214,662 B1 | * | 4/2001 | Sung et al. .................. 438/241 |
| 6,329,291 B1 | * | 12/2001 | Wang et al. ................. 438/233 |
| 6,346,448 B1 | * | 2/2002 | Kobayashi ................... 438/303 |

* cited by examiner

Primary Examiner—Tuan H. Nguyen
Assistant Examiner—Thanh Nguyen
(74) Attorney, Agent, or Firm—Pillsbury Winthrop LLP

(57) ABSTRACT

The present invention relates to a method for removing polysilicon layers used as a hard mask from contact holes without damaging the semiconductor substrate during the etching process. The present invention according to the present invention comprises the steps of: forming a nitride layer on a contact region to be contacted with a conducting layer; forming an interlayer insulation layer on the nitride layer, wherein the interlayer insulation layer has a different etching rate from the nitride layer so that the nitride layer acts as an etching barrier layer for the interlayer insulation layer; forming a polysilicon pattern on the interlayer insulation layer; etching the interlayer insulation layer using the polysilicon pattern as an etching mask, whereby a first opening to expose a portion of the nitride layer is formed; and etching the exposed nitride layer, thereby forming a second opening to expose the contact region.

9 Claims, 3 Drawing Sheets

METHOD FOR FORMING CONTACT HOLES FOR METAL INTERCONNECTION IN SEMICONDUCTOR DEVICES

FIELD OF THE INVENTION

The present invention relates to a method for forming contact holes for metal interconnections in semiconductor devices and, more particularly, to a method for removing a polysilicon pattern used as a hard mask for forming contact holes without also removing a portion of the semiconductor substrate in the contact region.

DESCRIPTION OF THE PRIOR ART

In a semiconductor device manufacturing process, an etching process for forming contact holes is essential for connecting unit devices. In forming the contact holes, it is especially important that the selective etching rate be appropriate in order to clear the metal contact holes without damaging underlying structures.

In a dynamic random access memory (DRAM), the main elements include a gate electrode, a bit line, a plate electrode and an active region. The upper layer of the gate electrode and the bit line are typically formed using a tungsten silicide layer and the capacitor plate electrode is typically formed using an amorphous silicon layer. The active region is, in turn, typically formed in an implanted single crystal silicon substrate.

FIG. 1 is a cross-sectional view illustrating a conventional method for forming contact holes for metal interconnection in semiconductor devices. In this method, a gate insulation layer 11 is formed on a semiconductor substrate 10. A gate electrode 12 is then formed on the gate insulation layer 11. An interlayer insulation layer 14 and a polysilicon layer 16 are then sequentially formed on the resulting structure. A photoresist pattern 18 is then formed on the polysilicon layer 16 in order to expose those areas in which metal interconnection contact holes will be formed through the interlayer insulation layer to the semiconductor substrate 10.

After forming the photoresist pattern 18, the polysilicon layer 16, the interlayer insulation layer 14 and the gate insulation layer 11 are etched to open a metal interconnection contact hole 19 using the photoresist pattern 18 as an initial etching mask and the polysilicon layer 16 as a hard etch mask. In this process, however, when the photoresist pattern 18 and the polysilicon layer 16 are subsequently removed, a portion of the semiconductor substrate 10 exposed at the bottom of the metal interconnection contact hole 19 may also be removed.

As described above, in the conventional method of forming contact holes for metal interconnection in semiconductor devices, the thick interlayer insulation layer 14 provides an etch processing margin over the hard mask formed from polysilicon layer 16. After the metal interconnection contact hole 19 has been formed, the photoresist pattern 18 and the polysilicon layer 16 are removed.

However, the portion of the semiconductor substrate which is exposed at the bottom of the metal interconnection contact hole 19 will be removed at approximately the same rate as the polysilicon layer 16. Accordingly, this lack of selectivity results in the removal of some of the semiconductor substrate during the etching process used to remove the polysilicon layer 16.

SUMMARY OF THE INVENTION

It is, therefore, an object of the present invention to provide a method for forming contact holes for metal interconnection in semiconductor devices that prevents the loss of semiconductor substrate in the contact area.

In the present invention, after forming a gate electrode, a nitride layer, which has a lower etching rate than both the interlayer insulation layer and the polysilicon layer, is formed on the resulting structure. This nitride layer acts to prevent the loss of the semiconductor substrate from the bottom of the contact holes by the etch used after the contact etch to remove the polysilicon layer. As a result, the present invention improves the operational characteristics and increases the yield of the resulting semiconductor devices.

In accordance with an aspect of the present invention, there is provided a method for forming metal interconnection contact holes for semiconductor devices comprising the steps of: forming a nitride layer on a contact region to be contacted with a conducting layer; forming an interlayer insulation layer on the nitride layer, wherein the interlayer insulation layer has a different and higher etching rate than the nitride layer, the nitride layer acting as an etching barrier layer during the interlayer insulation layer etch; forming a polysilicon layer on the interlayer insulation layer; etching the polysilicon layer to form a polysilicon pattern as a hard mask; etching the interlayer insulation layer using the polysilicon pattern as an etching mask, thereby forming a first opening that exposes a portion of the nitride layer; and etching the exposed nitride layer, thereby forming a second opening and exposing the contact region.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

FIGS. 2A to 2F are cross-sectional views showing a method for forming contact holes for metal interconnection in semiconductor devices in accordance with the present invention.

Figure 1:
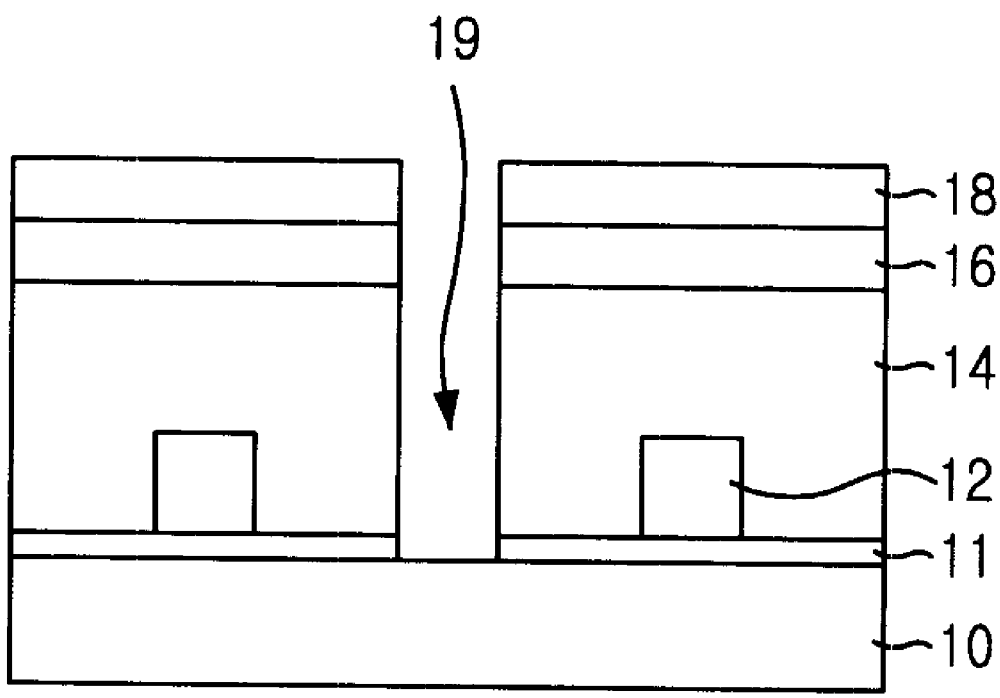
FIG. 1 is a cross-sectional view illustrating a conventional method for forming contact holes for metal interconnection in semiconductor devices.
Figure 2A:
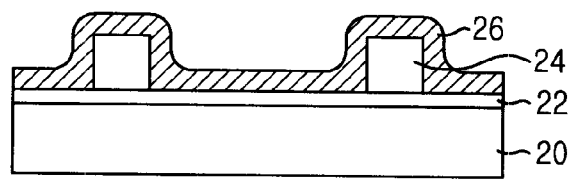
FIGS. 2A to 2F are cross-sectional views showing a method for forming contact holes for metal interconnection in semiconductor devices in accordance with the present invention.

Referring to FIG. 2A, a gate insulation layer 22 is formed on a semiconductor substrate 20 and a MOS field effect transistor is formed with a gate electrode 24 and adjacent source/drain regions (not shown). A nitride layer 26 is then formed on the resulting structure for use as an etching barrier layer during subsequent processing.

Figure 2B:
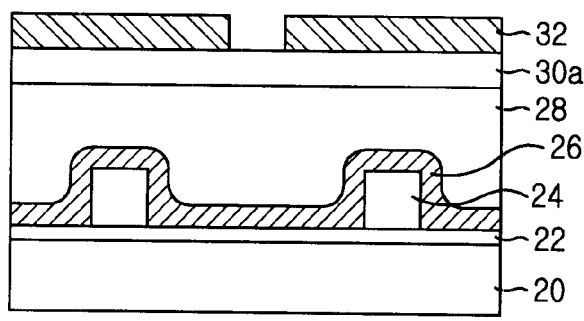

Referring to FIG. 2B, an interlayer insulation layer 28 and a polysilicon layer 30a are then sequentially formed on the nitride layer 26. A photoresist pattern 32, which exposes a portion of the polysilicon layer 30a, is then formed on the polysilicon layer 30a.

Figure 2C:
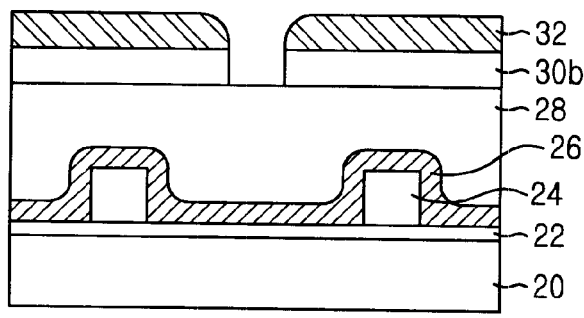

Referring to FIG. 2C, a polysilicon pattern 30b, is then formed by selectively etching the polysilicon layer 30a using the photoresist pattern 32 as an etching mask, to expose portions of the interlayer insulation layer 28. During this etching process, a portion of thickness of the photoresist pattern 32 is lost.

Figure 2D:
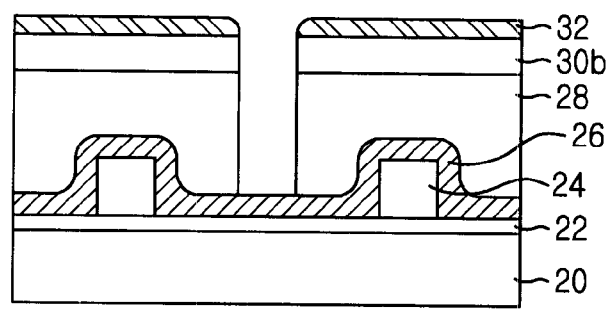

Referring to FIG. 2D, the interlayer insulation layer 28 is etched using a selective etching rate for the nitride layer 26, and using the photoresist pattern 32 and the polysilicon pattern 30b as an etching mask, thereby exposing a portion of the nitride layer 26. By the time this etch is complete, most of the photoresist pattern 32 has also been removed.

Figure 2E:
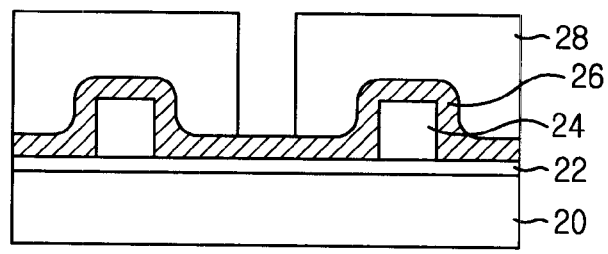

Referring to FIG. 2E, the photoresist pattern 32 and any etching residue that was generated during the previous etching process, are then removed. The polysilicon pattern 30b is then removed using an etch selective for polysilicon over the nitride layer 26.

Figure 2F:
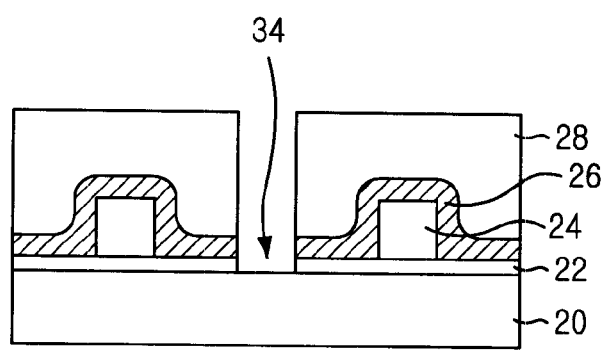

Referring to FIG. 2F, a metal connection contact hole 34 is formed by removing the exposed portion of the nitride layer 26 and the underlying portion of the gate insulation layer 22 using an etch that selectively removes the nitride and oxide but does not remove the underlying silicon.

As described above, a method for forming contact holes for metal interconnection in semiconductor devices in accordance with the present invention prevents the semiconductor substrate from being damaging during hard mask removal, thereby improving the electrical characteristics and the yield of the resulting semiconductor device. Also, the present invention may improve a manufacturing process of highly integrated circuits.

While the present invention has been described with respect to the particular embodiments, it will be apparent to those skilled in the art that various changes and modifications may be made without departing from the scope of the invention as defined in the following claims.

What is claimed is:

1. A method for forming a contact hole for metal interconnection of semiconductor devices, comprising:

forming a nitride layer on a contact region;

forming an interlayer insulation layer on the nitride layer, wherein the interlayer insulation layer has a different etching rate from the nitride layer;

forming a polysilicon pattern on the interlayer insulation layer;

etching the interlayer insulation layer to form a first opening using the polysilicon pattern as an etching mask and the nitride layer as an etch barrier, thereby exposing a portion of the nitride layer;

removing the polysilicon pattern; and then etching the exposed portion of the nitride layer to form a second opening, thereby exposing a portion of the contact region.

2. The method in accordance with claim 1, further comprising the step of forming a photoresist pattern on the polysilicon layer.

3. A method for forming a metal interconnection contact hole for a semiconductor device, comprising the steps of:

a) forming a MOS field effect transistor on a semiconductor substrate, the MOS field effect transistor comprising a gate structure with an adjacent contact region;

b) forming a nitride layer on the MOS field effect transistor;

c) forming an interlayer insulation layer on the nitride layer;

d) forming a polysilicon layer on the interlayer insulation layer;

e) forming a photoresist pattern on the polysilicon layer, the photoresist pattern exposing a portion of the polysilicon layer above the contact region;

f) etching the exposed portion of the polysilicon layer to form a hard mask using the photoresist pattern as an etching mask;

f) etching the interlayer insulation layer using the photoresist pattern and the polysilicon pattern as etching masks to expose a portion of the nitride layer;

g) removing the photoresist pattern and the polysilicon pattern; and h) etching the exposed portion of the nitride layer to form the metal interconnection contact hole and thereby expose a portion of the contact region of the semiconductor substrate, using an etch having a nitride etch rate that is greater than a interlayer insulation etch rate.

4. A method for forming a substrate contact to a contact region of a semiconductor substrate comprising the following sequence of steps:

a) forming a thin oxide layer on the contact region;

b) forming a nitride layer on the thin oxide layer;

c) forming an interlayer insulation layer on the nitride layer;

d) forming a polysilicon layer on the interlayer insulation layer;

e) forming a photoresist layer on the polysilicon layer; patterning the photoresist layer to form a photoresist pattern, the photoresist pattern exposing a portion of the polysilicon layer above the contact region;

f) etching the polysilicon layer using the photoresist pattern as an etch mask to form a polysilicon pattern, the polysilicon pattern exposing a portion of the interlayer insulation layer above the contact region;

g) etching the interlayer insulation layer to expose a portion of the nitride layer above the contact region using the polysilicon pattern as an etch mask, the etch conditions providing an interlayer insulation layer etch rate and a nitride layer etch rate, the interlayer insulation etch rate being greater than the nitride layer etch rate;

h) removing the photoresist pattern;

i) removing the polysilicon pattern, thereby exposing a surface of the interlayer insulator layer;

j) etching the exposed portion of the nitride layer to expose a portion of the thin oxide layer above the contact region;

k) etching the exposed portion of the thin oxide layer to complete a contact opening and expose a portion of the contact region; and l) forming a layer of conductive material on the exposed surface of the interlayer insulating layer, in the contact opening, and on the exposed portion of the contact region.

5. A method for forming a substrate contact to a contact region of a semiconductor substrate according to claim 4, wherein:

the interlayer insulation layer etch rate:nitride layer etch rate ratio is at least 3:1.

6. A method for forming a substrate contact to a contact region of a semiconductor substrate according to claim 4, wherein:

the interlayer insulation layer etch rate:nitride layer etch rate ratio is at least 5:1.

7. A method for forming a substrate contact to a contact region of a semiconductor substrate according to claim 4, wherein:

the interlayer insulation layer has a first thickness;

the nitride layer has a second thickness;

and the first thickness:second thickness ratio is at least 5:1.

8. A method for forming a substrate contact to a contact region of a semiconductor substrate according to claim 4, further comprising a step of:

planarizing the interlayer insulation layer, the planarizing step being completed before the step of forming the polysilicon layer.

9. A method for forming a substrate contact to a contact region of a semiconductor substrate according to claim 8, wherein the step of planarizing the interlayer insulation layer comprises a Chemical Mechanical Polishing (CMP) process.

* * * * *